United States Patent
Kwon et al.

(10) Patent No.: US 7,136,553 B2
(45) Date of Patent: Nov. 14, 2006

(54) TUNABLE DEMULTIPLEXER AND TUNABLE LASER WITH OPTICAL DEFLECTOR

(75) Inventors: Oh Kee Kwon, Daejeon (KR); Kang Ho Kim, Daejeon (KR); Jong Hoi Kim, Daejeon (KR); Hyun Soo Kim, Daejeon (KR); Kwang Ryong Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/166,327

(22) Filed: Jun. 24, 2005

(65) Prior Publication Data

US 2006/0127006 A1  Jun. 15, 2006

(30) Foreign Application Priority Data

Dec. 14, 2004 (KR) .................. 10-2004-0105679

(51) Int. Cl.
G02B 6/34 (2006.01)
H04J 14/02 (2006.01)

(52) U.S. Cl. .................. 385/37; 385/14; 385/129; 385/130; 385/131; 385/122; 398/79; 398/82; 398/87; 398/84

(58) Field of Classification Search .................. 385/14, 385/37, 40, 88, 89, 24, 129, 130, 131, 36, 385/122; 398/79, 80, 81, 82, 83, 84, 95, 398/87

See application file for complete search history.

(56) References Cited

U.S. PATENT DOCUMENTS

| 4,872,746 A | 10/1989 | Kobayashi | .................. 350/358 |
| 5,206,920 A * | 4/1993 | Cremer et al. | ................. 385/37 |
| 5,581,639 A * | 12/1996 | Davies et al. | ................. 385/10 |
| 5,666,374 A * | 9/1997 | Weber | ......................... 372/20 |
| 6,434,299 B1 * | 8/2002 | Yudin et al. | .................. 385/37 |
| 2003/0091265 A1 | 5/2003 | Lin et al. | ...................... 385/15 |
| 2003/0112838 A1 | 6/2003 | Oh et al. | ...................... 372/20 |

OTHER PUBLICATIONS

"Tunable Planar Concave Grating Demultiplexer" McGreer, IEEE Photonics Technology Letters, vol. 8, No. 4, Apr. 1996, pp. 551-553.
"Theory and Stimulation of a Concave Diffraction Grating Demultiplexer for Coarse WDM Systems" McMullin et al., Journal of Lightwave Technology, vol. 20, No. 4, Apr. 2002, pp. 758-765.
"Monolithic Integrated Wavelength Demultiplexer Based on a Waveguide Rowland Circle Grating in InGaAsP/InP" He et al., Journal of Lightwave Technology, vol. 16, No. 4, Apr. 1998, pp. 631-638.
Kang Ho Kim et al, "InGaAsP/InP Laser Diodes Monolithically Integrated with Waveguide-Type Light Deflectors," Japaneses Journal of Applied Physics, vol. 43, No. 4B, Apr. 15, 2004, pp. L543-L544.
Oh Kee Kwon et al, "Proposal of Electrically Tunable External-Cavity Laser Diode," IEEE Photonics Technology Letters, vol. 16, No. 8, Aug. 2004, pp. 1804-1806.

* cited by examiner

Primary Examiner—Brian M. Healy
(74) Attorney, Agent, or Firm—Ladas & Parry LLP

(57) ABSTRACT

Provided are a tunable demultiplexer and a tunable laser, having an optical deflector in which a refractive index of a core layer of a deflection pattern region having a predetermined shape varies in response to an external electrical signal so that the optical deflector deflects incident light in the radial direction.

14 Claims, 15 Drawing Sheets

TUNABLE DEMULTIPLEXER AND TUNABLE LASER WITH OPTICAL DEFLECTOR

CROSS-REFERENCE TO RELATED APPLICATION

This application claims priority to and the benefit of Korean Patent Application No. 2004-105679, filed Dec. 14, 2004, the disclosure of which is incorporated herein by reference in its entirety.

BACKGROUND

1. Field of the Invention

The present invention relates to a tunable demultiplexer, and a tunable laser, and more specifically, to an optical device having an optical deflector that deflects radially spreading light, which has a predetermined type of deflection pattern region and a peripheral region arranged with a boundary due to a difference in a doping structure of an upper cladding layer, and has a refractive index of a core layer that varies in the deflection pattern region by control of an external electrical (current or voltage) signal.

2. Discussion of Related Art

First, a tunable demultiplexer will be described.

In an optical communication system, especially, a wavelength division multiplexing (WDM)-based optical system, it is necessary to have functions such as multiplexing for gathering various wavelengths of beams into one place, and demultiplexing for distributing any beam over a specific place according to wavelength.

So far, these functions are implemented with various methods and constructions, such as using a prism, an integrated concave grating, or an arrayed waveguide grating.

Among these, constructions using the integrated concave grating and arrayed waveguide grating can be formed with an optical waveguide based on material such as silica, GaAs, InP, LiTaO$_3$, and polymer, thereby facilitating integration and enhancing device capability. Thus, the constructions using the integrated concave grating and arrayed waveguide grating, such as the construction schematically shown in FIG. 1, are widely used.

Hereinafter, a demultiplexer using the conventional concave grating will be described with reference to FIG. 1. FIG. 1 is a schematic diagram showing a demultiplexer using the conventional concave grating.

While the demultiplexer is shown in FIG. 1, the device shown herein may also be used as a multiplexer since they are reciprocal in terms of incident beam and exit beam. Therefore, for the sake of brevity, only the demultiplexer will be described.

The waveguide type concave grating construction having the demultiplexing function described above is shown in FIG. 1. When beams having broadband optical signals are incident on an input waveguide 10 in the above construction, the beams propagate through the input waveguide 10 toward a grating 30 at a point A. The propagating beams are diffracted at the grating 30 and distributed into respective output waveguides 20 according to wavelength. Here, the distributed beams are always located on a locus referred to as a Rowland circle. A radius R of the concave grating is a diameter of the Rowland circle, and a point where the concave grating and the Rowland circle intersect is referred to as a pole.

The detailed construction and application regarding the conventional construction is disclosed in document 1 ("Monolithic Integrated Wavelength Demultiplexer Based On a Waveguide Rowland Circle Grown In InGaAsP/InP", IEEE Journal of Lightwave Technology, vol. 16, no. 4, April 1998) and document 2 (Theory and Simulation of a Concave Grating Demultiplexer for Coarse WDM Systems" IEEE Journal of Lightwave Technology, vol. 20, no. 4, April 2002.)

The tunable demultiplexer according to the prior art will be described. When a concave grating-type tunable demultiplexer is used, a construction may be used where several input waveguides are fabricated and beams having broadband optical signals are incident into one of the input waveguides. In this case, the incident beam is located on the Rowland circle, and an incident angle of the incident beam is changed to tune the wavelength based on the grating formula. For example, in a case where, for the above construction, a beam is incident into one waveguide and beams having wavelengths $\lambda_1$ to $\lambda_n$ exit out of respective output waveguides, when a beam is incident into another waveguide, the wavelengths exiting out of the out waveguides are changed into $\lambda'_1$ to $\lambda'_n$, respectively.

In this construction, the position of the incident beam is selectively adjusted to change the wavelength, and thus there are problems in that several input waveguides are required, a wavelength is tuned discretely, and an amount of tunable wavelength is restrictive.

In another construction, beams are incident into an optical fiber instead of the input waveguide, and the position of the optical fiber is moved to operate the tunable demultiplexer. This construction is disclosed in detail in document 3 ("Tunable Planar Concave Grating Demultiplexer", IEEE Photonic Technology Letter, vol. 8, no. 4, April 1996). Here, the position of the optical fiber can be continuously moved, so that a wavelength can be tuned continuously. However, there are problems in that the construction is not structurally stable due to spatial movement of the optical fiber, and a speed for tuning wavelength is low.

Further, an arrayed waveguide grating construction may be used in the tunable demultiplexer. In other words, various input waveguides are used. When the radiating beam is moved from one point to another point in the construction, a phase of the beam coupled to the input aperture in an input coupler varies and a wavelength of the beam exiting out of the output waveguide is also changed.

The construction using the arrayed waveguide grating is based on the same principle as the construction using the concave grating, so that owing to its discrete wavelength tuning characteristic, it is difficult to use as a demultiplexer having a continuous tunable wavelength characteristic.

Therefore, among the conventional tunable multiplexer/demultiplexer, the construction using several input waveguides is not useful due to its discrete wavelength tuning characteristic, and the construction using the optical fiber is not structurally stable due to movement of the optical fiber and it has a low tuning speed.

Next, a tunable laser will be described.

Recently, with the advent of new multimedia technology such as VOD and video conferencing, and the ongoing development of conventional data communications technology such as HDTV, LAN, and CATV, etc., a capacity of information is rapidly increasing. To maximize transfer efficiency, very high-speed IT network carriers use a wavelength division multiplexing transmission system that maximizes a bandwidth of existing optical fiber, instead of establishing a new optical fiber, which takes an enormous amount of time and money.

When the optical transmission system described above is used, optical devices having various functions are required. Here, a tunable wavelength semiconductor laser has attracted attention as a light source having the widest application range in the communication network.

The tunable wavelength semiconductor laser has mainly been used for optical measurement prior to the WDM transmission system, but after that, it is used as a substitute or emergency backup for fixed wavelength semiconductor lasers, and is in high demand as a light source of a reconfigurable optical add/drop multiplexer (ROADM). In addition, its applications have been expanded to various devices such as a packet switch, a wavelength converter, and a wavelength router of an optical network.

Many types of the tunable wavelength semiconductor laser have been proposed so far, and among them, a distributed Bragg reflector laser diode and an external cavity laser diode (ECLD) are widely used. A construction of the ECLD will be described in detail for comparison with the construction of the present invention.

The ECLD comprises a semiconductor laser and an external diffraction grating, and can obtain a continuous tunable wavelength characteristic by changing a diffraction condition with a spatial adjustment (rotational or translational movement) of the grating. The ECLD described above is widely used in a conventional measuring apparatus, due to its high output power, narrow bandwidth, and wide tuning range. However, it poses problems such as difficulty in properly arranging the semiconductor laser and the grating with respect to one another, mechanical vibration due to movement of the grating in wavelength tuning, and a wavelength shift due to aging of the location of a pivot point. In particular, a tuning speed is extremely low so that it is not feasible to use the ECLD in optical communication systems.

To address the low reliability and slow tuning speed of the ECLD construction described above, a construction in which the wavelength is electrically adjusted has been proposed.

In "Continuous tuning of an electrically tunable external-cavity semiconductor laser" Optics Lett., vol. 25, no. 16, pp. 1165–1167, August 2000, M. Kourogi, et al. proposed that wavelength tuning be performed using a beam deflection characteristic according to frequency variation of an external electrical signal, by inserting an acousto-optic modulator (AOM) between a laser diode and a grating rather than moving the grating. However, the aforementioned construction has a large AOM, a large insertion loss, and an extremely small frequency variation as much as only 2 nm.

Korean Patent Number No. 444,176 entitled "Optical deflector using electrical signal and tunable external resonator using the same" of K. Y. Oh, et al. proposes a tunable laser in a Littman external resonator comprising a semiconductor laser diode (or optical amplifier), a lens, a grating, and a reflective mirror. In the proposed construction, a deflector for deflecting a direction of a beam is inserted between the grating and the reflective mirror, and a current is injected to change a refractive index of a medium in the deflector and adjust an angle of incidence on the reflective mirror, to thus perform wavelength tuning.

In "Proposal of electrically tunable external-cavity laser diode" IEEE Photon Tech Lett., vol. 16, no. 8, pp. 1804–1806, August 2004, O. K. Kwon, et al. propose a construction in which a deflector is integrated into a semiconductor laser diode and a position of a waveguide beam varies due to a current injected into a deflector region to change an incident angle of a grating and thereby perform wavelength tuning. As described above, an external resonator-type tunable laser having an inserted or integrated deflector has a high speed and is structurally simple, but it is difficult to properly arrange the grating and the laser diode with respect to one another, and a device is large due to the lens and the grating.

Thus, the ECLD, or the conventional tunable laser, has a problem in that it is difficult to properly arrange the laser diode, the external grating, the lens, and the reflective mirror, and the device is large due to insertion of the additional optical parts.

SUMMARY OF THE INVENTION

The present invention is directed to a tunable demultiplexer that has an improved manufacturing yield, compared with the conventional demultiplexer, and that can be utilized in various WDM devices such as a tunable filter and a router.

The present invention is also directed to a tunable demultiplexer that has continuous wavelength tuning, is easy to fabricate, is structurally stable, and is quick to tune.

The present invention is also directed to a tunable demultiplexer that has continuous wavelength tuning, is easy to fabricate, has a single integrated construction, has a small-size, is structurally stable, and is quick to tune.

One aspect of the present invention provides a tunable demultiplexer comprising: an input waveguide through which beams having a plurality of different wavelengths are guided; an optical deflector through which the beams transmitted through the input waveguide are deflected into radially spreading beams, the optical deflector comprising a peripheral region having a first effective refractive index and a deflection pattern region having a predetermined shape bounded by the peripheral region and a second effective refractive index different from the first effective refractive index; a grating for diffracting the deflected beams according to wavelength; and output waveguides for outputting and selecting the diffracted beams through the grating, wherein the radially spreading beams propagate starting from a specific point on a Rowland circle that varies with the second effective refractive index.

Preferably, the deflection pattern and the peripheral region are divided by a difference in doping of an upper cladding layer, and the external electrical (current or voltage) signal is applied only to the deflection pattern region to change the second effective refractive index.

The optical deflector may comprise a lower cladding layer, an upper cladding layer, and a core layer, and a medium of the core layer for the deflection pattern region and the peripheral region may be the same and only doping of the upper cladding layer may be different. In this case, when the electrical signal is not applied (or current is not injected) into the deflection pattern region, the refractive indexes are the same. And when the current is injected or the voltage is applied, only to the core layer of the deflection pattern region, the refractive index of the deflection pattern changes.

Another aspect of the present invention provides a tunable demultiplexer comprising: an input waveguide through which beams having a plurality of different wavelengths are guided; an input coupler comprising an optical deflector through which the beams transmitted through the input waveguide are deflected into radially spreading beams, wherein the optical deflector comprises a peripheral region having a first effective refractive index and a deflection pattern region having a predetermined shape bounded by the peripheral region and a second effective refractive index different from the first effective refractive index; a waveguide through which the beams transmitted through the input coupler propagate; and an output coupler to which the beams output through the waveguide are coupled, wherein the radially spreading beams propagate starting from a specific point on a Rowland circle that varies with the second effective refractive index.

Still another aspect of the present invention provides a tunable laser comprising: an optical amplifier having first and second ends; an optical deflector integrated into the optical amplifier for transmitting beams exiting from the first end to a concave grating and receiving the beams reflected from the concave grating at the second end, the optical deflector comprising a peripheral region having a first effective refractive index and a deflection pattern region having a predetermined shape bounded by the peripheral region and a second effective refractive index different from the first effective refractive index; and a grating connected to the optical deflector for feeding back to the optical amplifier only a specific wavelength among the beams from the optical deflector, wherein the radially spreading beams propagate starting from a specific point on a certain trace that varies with the second effective refractive index.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

The present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

(Tunable Demultiplexer According to First Embodiment)

Figure 1:
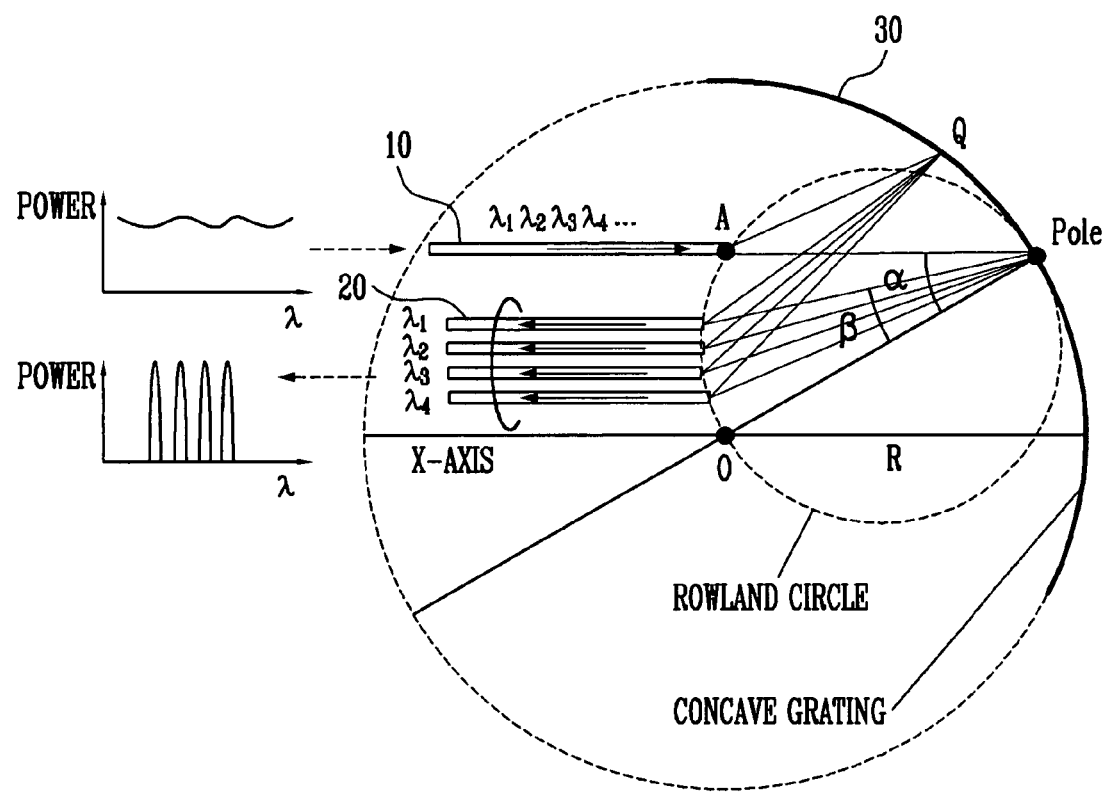
FIG. 1 is a schematic diagram of a demultiplexer using a conventional concave grating.
Figure 2:
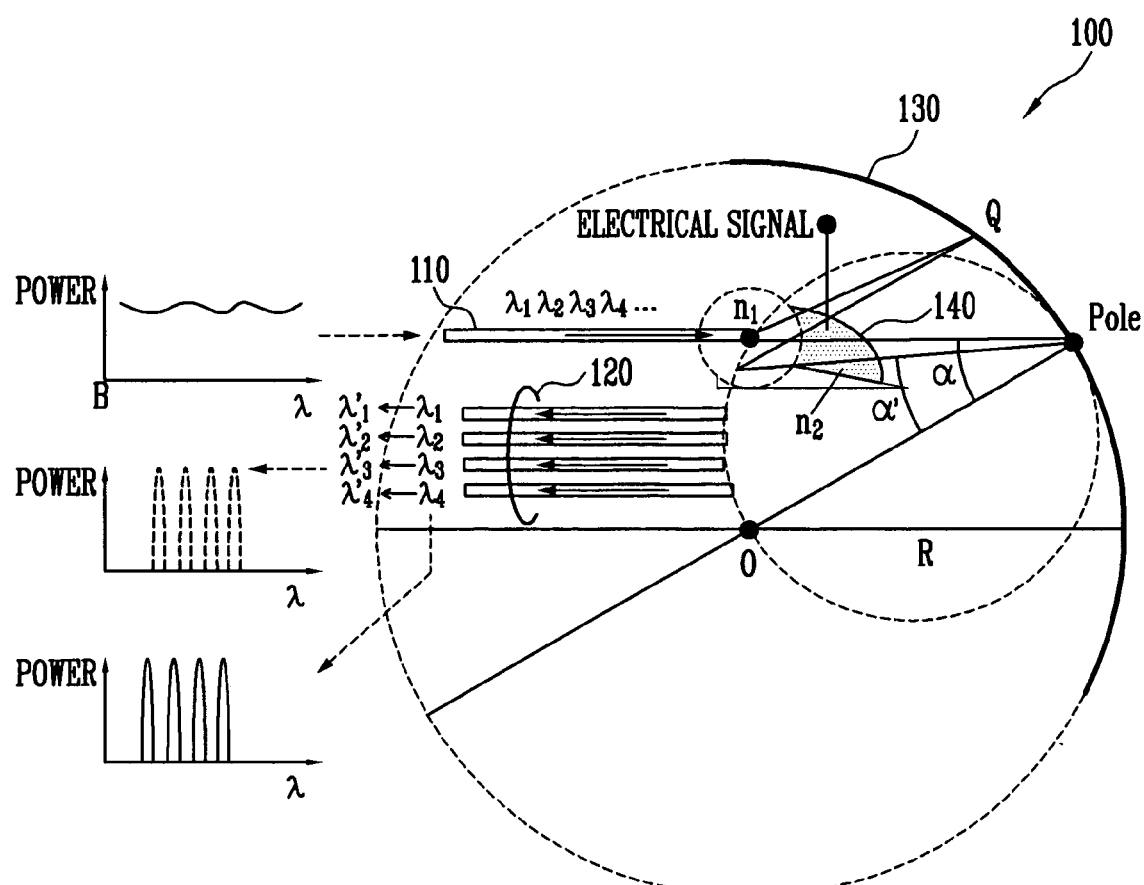
FIG. 2 is a schematic diagram of a tunable demultiplexer according to a first embodiment of the present invention.

A tunable demultiplexer according to a first embodiment of the present invention will now be described with reference to FIG. 2.

A tunable demultiplexer 100 comprises an input waveguide 110 through which beams having different wavelengths are guided; an optical deflector 140 which deflects the beams transmitted through the input waveguide 110 into radially spreading beams; a grating 130 for diffracting the deflected beams according to wavelength; and an output waveguide 120 for selecting and outputting the beams diffracted from the grating 130.

The optical deflector 140 deflects spreading beams to change an angle of incidence on the grating pole from $\lambda$ to $\lambda'$. Therefore, wavelengths $\lambda_1$, $\lambda_2$, $\lambda_3$, $\lambda_4$ of the beams deflected through the output waveguide 120 are changed into $\lambda'_1$, $\lambda'_2$, $\lambda'_3$, and $\lambda'_4$ based on a grating formula.

Further, a light source of the deflected beams is designed to move along a Rowland circle, and a position of the light source of the deflected beam virtually moves along the Rowland circle continuously.

Figure 3A:
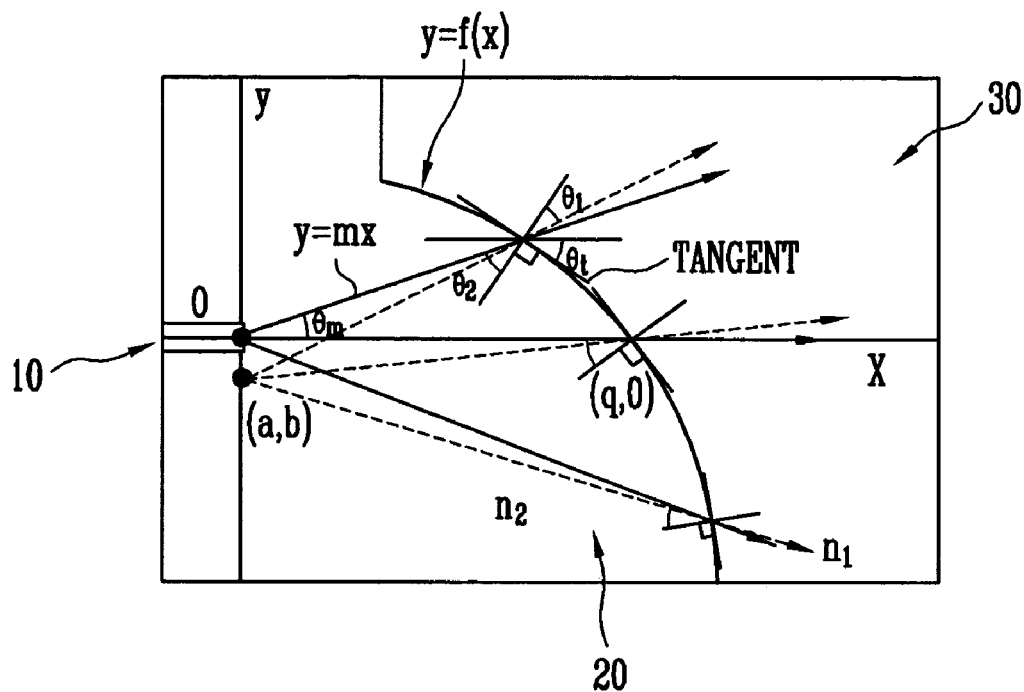
FIGS. 3A to 3D are diagrams for illustrating an optical deflector of FIG. 2.
Figure 3B:
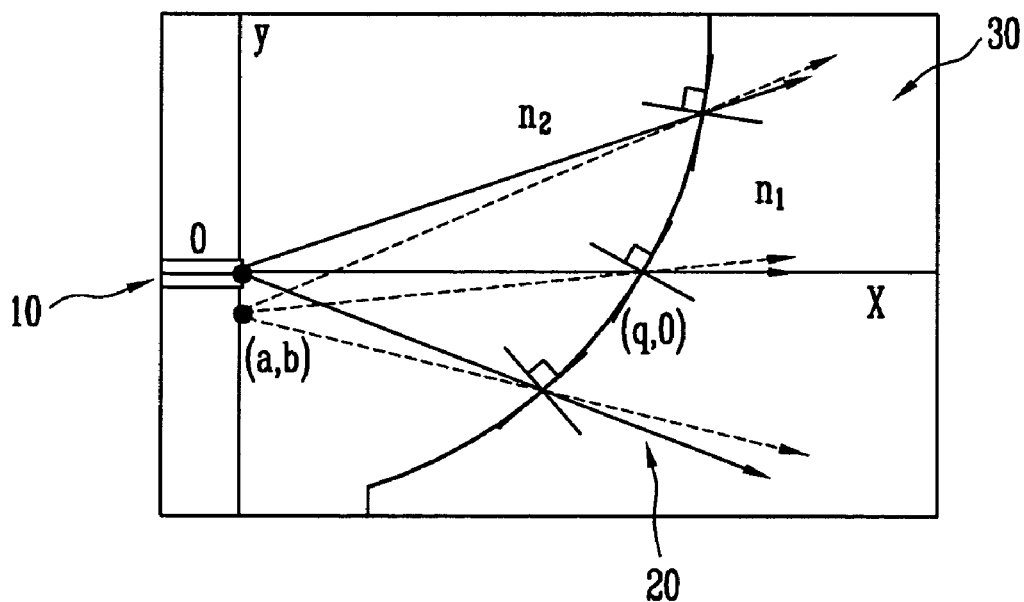

Hereinafter, the optical deflector 140 will be described in detail with reference to FIGS. 3A to 3C. Referring to FIG. 3A, the optical deflector 140 comprises a peripheral region 141 having a first effective refractive index $n_1$, and a deflection pattern region 142 having a predetermined shape and a second effective refractive index $n_2$ and forming a boundary f(x) with the peripheral region 141. Due to the optical deflector 140, when beams propagate through the input waveguide 110, they are deflected in a propagating direction starting from a specific point (a, b) by the boundary f(x) of the predetermined deflection pattern. Further, the position of the specific point (a, b) varies with the second effective refractive index $n_2$. In other words, a virtual light source (a, b) of the beams passing through the deflection pattern region 142 can be shown along any locus such as a line or a circle, within a limited interval, by varying the second effective refractive index $n_2$. Therefore, the tunable demultiplexer according to the embodiment of the present invention may be implemented such that radially propagating beams originate from the specific point on the Rowland circle.

The "effective refractive index" of each region is not for the medium but for the waveguide. The effective refractive index is different from the medium's refractive index, and is one of the eigen-modes of the waveguide. The effective refractive index varies with the width of the waveguide, the thickness of a core layer, and the refractive index of the core layer. For reference, even when the deposited material is the same, the effective refractive index of the input waveguide 110 may be different from the refractive index outside due to the thickness of the input waveguide 110.

The locus y=f(x) forming the boundary of the deflection pattern region 142 having the predetermined shape can be found by the following method based on ray-optics. Assuming that an x-intercept of the locus y=f(x) is q, the slope of a tangent of the locus y=f(x) at a point where any radiating beam y=mx (m=tan($\theta_m$)) intersects y=f(x) is t (t=tan($-\theta_t$)), and an angle between a radiating angle and a normal to the tangent of the locus is $\theta_1$(incident angle), then Equation 1 can be derived:

$$-\theta_t = \pi/2 - \theta_2 - \theta_m \qquad \text{[Equation 1]}$$

Here, Equation 1 is derived because the slope t of the tangent is negative and $\theta_r$ is a positive angle. Further, taking the tan of both sides of Equation 1 reduces the left side to obtain Equation 2:

$$\tan(-\theta_t)=[m\tan(\theta_2)-1]/[m+\tan(\theta_2)]=t=y' \quad \text{[Equation 2]}$$

where m (=y/x) and $\tan(\theta_2)$ are functions of x and y, and $\tan(-\theta_t)$ indicates the slope t of the tangent of the locus y=f(x), so that y is a first differential (y'), which represents the first differential equation with respect to x. Further, assuming that $\theta_1$ of FIG. 3A indicates a refractive angle of the deflected beam, and the deflected beam (dotted line) has the virtual origin (a, b), Equation 3 is obtained:

$$y=\tan[\theta_m-(\theta_1-\theta_2)](x-a)+b \quad \text{[Equation 3]}$$

where $\theta_1$ and $\theta_2$ satisfy Snell's law ($n_1 \sin\theta_1 = n_2 \sin\theta_2$). When $\theta_1$ is for $\theta_2$, Equation 3 can be reduced to Equation 4:

$$[Bn_2+\sqrt{(n_1^2-n_2^2)+(n_1/\tan(\theta_2))^2}]\tan(\theta_2)-[n_2-B\sqrt{(n_1^2n_2^2)+(n_1/\tan(\theta_2))^2}]=0$$

$$B=(m(x-a)-(y-b))/(m(y-b)+(x-a)) \quad \text{[Equation 4]}$$

The locus y=f(x) can be found by substituting $\tan(\theta_2)$ obtained from Equation 4 and solving the differential equation with an initial value (q, 0). In the method of finding f(x) described above, $\tan(\theta_1)$ of Equation 4 appears both inside and outside the square root, which makes the equation difficult to solve. A general solution to the differential equation of Equation 2 has a term x associated with a term y, so it is difficult to solve analytically. Therefore, Equation 4 is solved numerically using a self-consistent method with respect to $\tan(\theta_2)$, and Equation 2 is solved using the Runge-Kutta method to obtain the locus. The specifics of the numerical analysis methods used here are well known in the art.

Further, in the semiconductor optical waveguide construction, the effective refractive index can be increased or decreased by means of an injected current. This depends on bandgap energy of the core layer with respect to the wavelength of the incident light. In general, when the composition of the core layer is provided such that the bandgap energy of the core layer is larger than the energy of the incident light, the effective refractive index is reduced by current injection. This is because optical loss is reduced when the bandgap energy of the core layer is larger than the wavelength energy of the incident light. However, while optical loss is reduced, range of variation of the refractive index is also reduced. Thus, it is desirable to design the semiconductor optical waveguide construction considering range of variation of the refractive index.

Therefore, while a mathematical model for solving the locus of FIG. 3A is described herein for the case of $n_1>n_2$, the same analytical process may be applied to solve a locus for the case of $n_1<n_2$.

Further, while in the mathematical model described above it is shown that the slope t of the tangent at an intersection of the locus and the radiating beam is a negative value, the same model is also applicable when the slope t is a positive value. In this case, the shape of the locus can be changed by switching $\theta_m$ and $\theta_1$ with respect to $\theta_r$. The approximate shape of the resulting y=f(x) is shown in FIG. 3B.

In addition, while the analytical mode of FIG. 3A shows only a case where the beam radiates from the left to the right, the shape of the locus can be changed for a case where the beam radiates from the right to the left, and it will be appreciated that the locus is symmetric with respect to the y-axis.

Figure 3C:
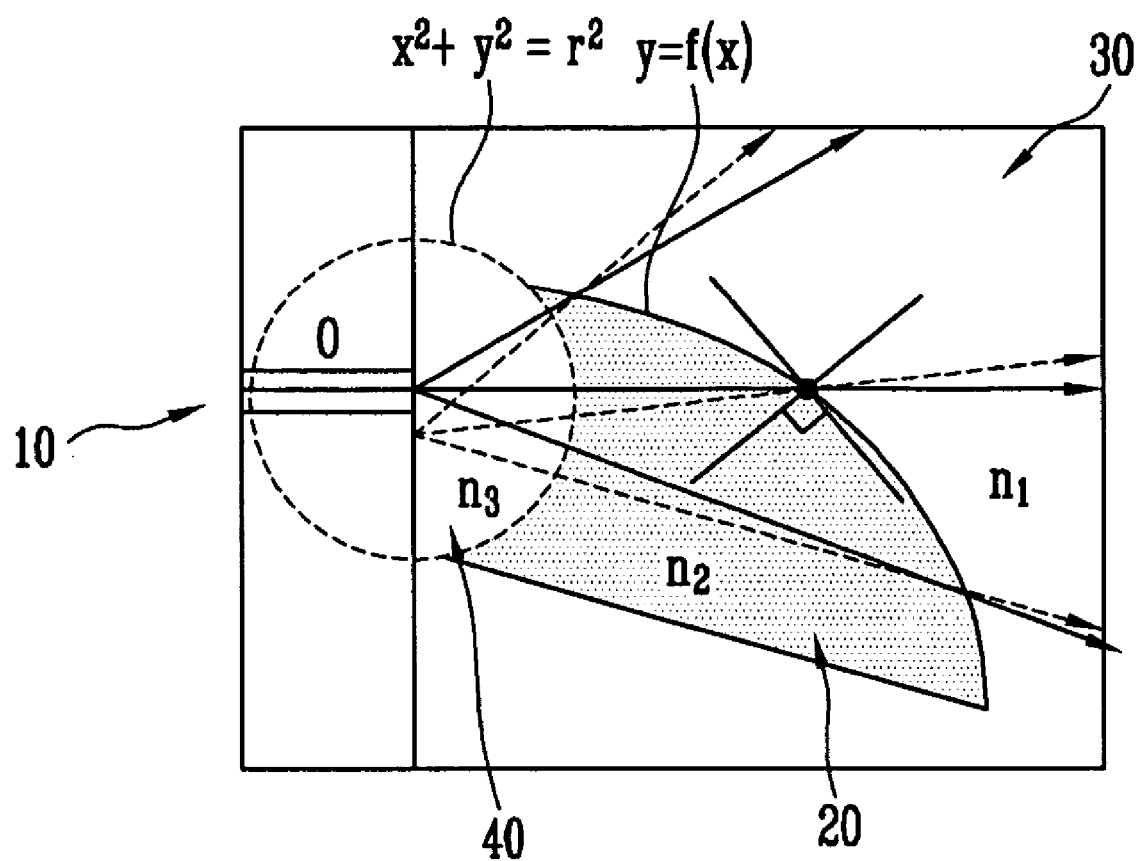

Further, FIG. 3C is a schematic diagram for illustrating a modified example of the optical deflector described above.

An optical deflector of FIG. 3C further comprises a circular pattern region 143 having a third effective refractive index $n_3$ for generating radially propagating beams, between the deflection pattern region 142 and the input waveguide 110. In the circular pattern region 143, when beams radiating from an origin O pass through a semicircle ($x^2+y^2=r^2$, x>0) having a boundary of the effective refractive indexes $n_3$ and $n_2$, the radiating beam is always perpendicular to the tangent of the circle so that refraction does not occur because incidence does not occur. Further, the third effective refractive index $n_3$ of the circular pattern region 143 may be equal to the first effective refractive index $n_1$. The beams radiating out of the circular pattern region 143 pass through a circle having a radius of r and a boundary of the effective refractive indexes $n_3$ and $n_2$, and when the beams pass through the boundary, no refraction occurs. The passed beams are refracted again while passing through the boundary that indicates the locus of f(x), and here, the refracted beams always have the virtual origin (a, b).

In other words, comparing the optical deflector of FIG. 3C with the optical deflector of FIG. 3A, in the optical deflector of FIG. 3C, the origin or basis for forming the radiating beams is arranged outside the deflection pattern region 142. FIG. 2 illustrates this case. For the optical deflector of FIG. 3A, the origin or basis for forming the radiating beams is arranged inside the deflection pattern region 142 or the boundary thereof, so that the circular pattern region 143 of the optical deflector of FIG. 3C is not necessary.

An embodiment of the optical deflector has been described from a standpoint of ray-optics in accordance with the Rowland circle, and alternatively, it can also be generalized from a standpoint of wave-optics as well. Accordingly, depending on the construction of the grating, the shape and number of the deflector pattern may be modified.

Figure 3D:
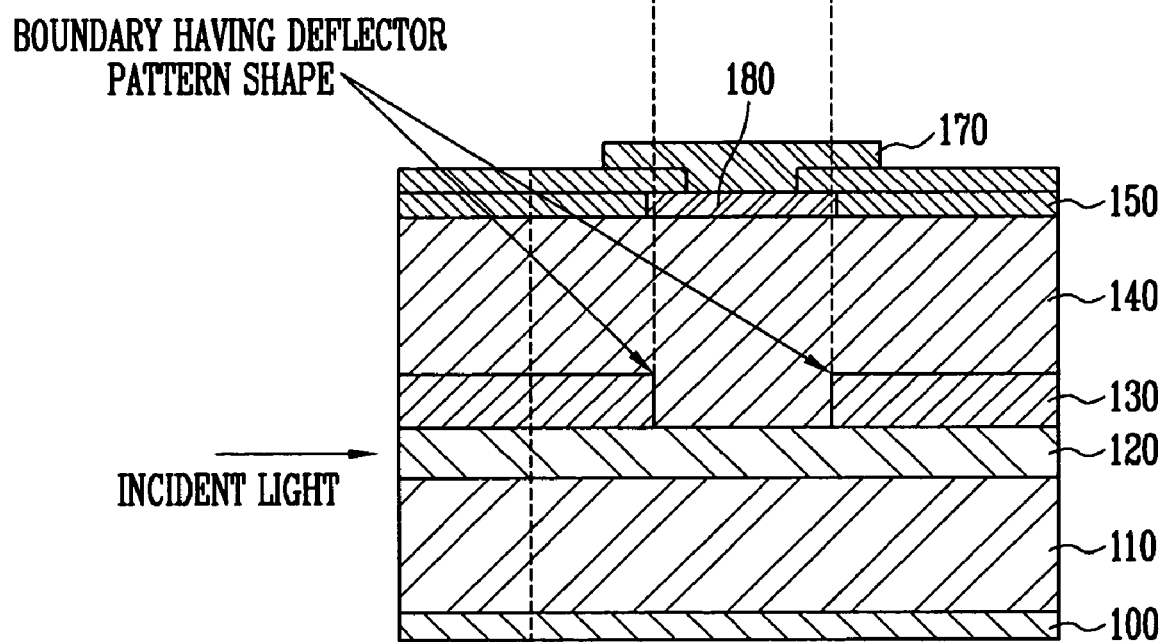

FIG. 3D is a cross-sectional view showing actual implementation of an example of the optical deflector of the present invention, implemented with InP series material, taken along line A–A' of FIG. 3C.

Referring to FIG. 3D, the optical deflector largely comprises an n-metal layer 1100, a p-metal layer 1170, an upper cladding layer 1130 and 1140, a core layer 1120, and a lower cladding layer 1110. A dielectric layer 1150 is also shown.

The n-metal layer 1100 is made of, for example, a Cr—Au layer, and the p-metal layer 1170 is made of a Ti—Pt—Au layer to improve conductivity. An InGaAs metal contact layer 1180 is heavily p-doped for facilitating conduction between the p-metal layer 1170 and the upper cladding layer 1130 and 1140. The InP upper cladding layer 1130 and 1140 is separately n-doped and p-doped, as shown in FIG. 3D, and the boundary between the p-doped InP and the n-doped InP is a boundary of the deflection pattern of FIG. 3C. IV group (Si, Ge) or VI group elements are used as a source to p-dope or n-dope the InP (III–V).

In this construction, all of the medium refractive indexes of the cladding layers 1110, 1130, and 1140 are about 3.17, regardless of the doping. The InGaAsP core layer 1120 is not doped and its medium refractive index is relatively higher than the cladding layers 1110, 1130, and 1140 due to the presence of Ga and As, so that light beams are guided through the InGaAsP core layer 1120.

In this construction, when no current is injected, the effective refractive index of the waveguide has a specific value $n_1$. When current is injected, it corresponds to a forward bias in a typical p-n junction so that the current flows through the p-metal layer 1170, the metal contact layer 1180, the upper cladding layer 1130 and 1140, the InGaAsP core layer 1120, the lower cladding layer 1110, and the n-metal layer 1100.

Here, the current injected into the upper cladding layer 1130 and 1140 flows only toward the p-doped InP in the deflector pattern due to a potential barrier between the p-doped InP and the n-doped InP. With this construction, the current is injected only into the deflector pattern, and the medium refractive index of the deflector pattern in the core layer is changed. Therefore, the effective refractive index in the deflector pattern is changed from $n_1$ to $n_2$ due to a variation of the medium refractive index of the core layer.

In the construction described above, the deflector pattern may be arranged in the metal contact layer rather than the upper cladding layer. However, when the electrode or the metal contact layer is formed as the deflector pattern, the current diffuses into the upper cladding layer so that the pattern of the current reaching an active layer is different from the deflector pattern, which may be not as effective as the construction of FIG. 3D. Further, in the construction shown in FIG. 3D, the deflector pattern is formed in the upper cladding layer immediately above the core layer, rather than on the electrode or the metal contact layer, so the current flows only through the pattern and is injected into the core layer. Thus, a stable deflection characteristic can be obtained.

Further, when the wavelength of the incident light is 1.55 µm, the medium refractive index is generally reduced to about 0.05 at the utmost due to the current injection. However, when the wavelength of the incident light is different in the InP/InGaAsP material, or in a different material (such as GaAs/AlGaAs or GaAs/InGaAs) for use in the semiconductor optical device, variation in the refractive index due to the current injection is different. Further, in addition to variation in the refractive index due to the current injection, application of voltage, an electro-optical effect, an acousto-optical effect, etc. can be used to increase or decrease the refractive index.

Figure 4:
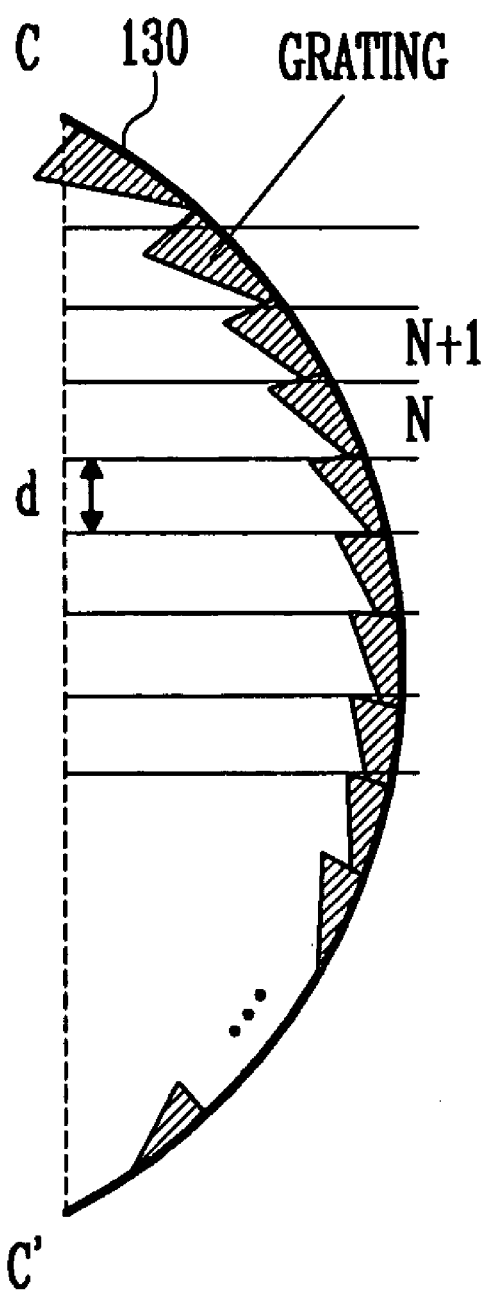
FIG. 4 is a diagram showing an exemplary construction of a grating in the tunable demultiplexer according to the present invention.

FIG. 4 is a diagram showing an exemplary construction of a grating in the tunable demultiplexer of the present invention. The grating can be constructed in several ways, such as chirped grating, blazed grating, Total Internal Reflection (TIR) grating, and sinusoidal grating and so on.

Referring to FIG. 4, the grating has a lattice structure having a period d in the line segment CC', and a phase difference between a beam input and reflected into the Nth grating and a beam input and reflected into the N+1th beam should be 2 mp for a grating order m. An included angle a between a line connecting a point A to a pole point and x-axis becomes an angle of incidence on the grating 130, and a diffraction characteristic of light incident on the grating 130 follows the grating formula of Equation 5:

$$m\lambda = nd(\sin\alpha + \sin\beta)$$ [Equation 5]

where $\lambda$ is wavelength, n is the medium refractive index, $\alpha$ is an incident angle, and $\beta$ is an mth order diffraction angle.

Further, if the angle at which beams deflected through the optical deflector 140 are incident on the grating 130 changes, the wavelengths of the beams diffracted to the output waveguide change based on the grating formula of Equation 1.

(Tunable Demultiplexer According to Second Embodiment)

Figure 5:
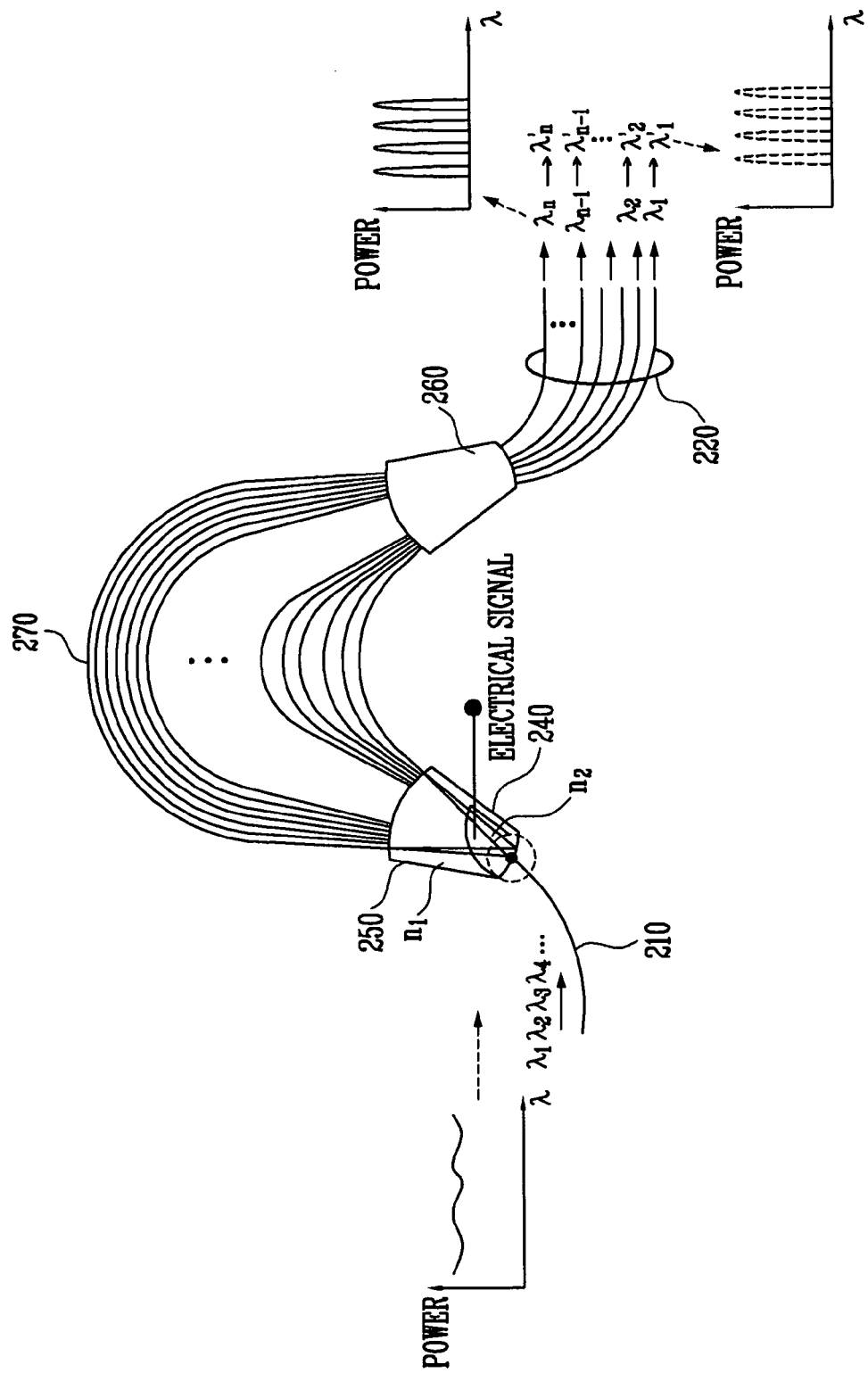
FIG. 5 is a schematic diagram of a tunable demultiplexer using an arrayed waveguide grating according to a second embodiment of the present invention.

A tunable demultiplexer using an arrayed waveguide grating according to a second embodiment of the present invention will now be described with reference to FIG. 5, a schematic diagram thereof.

The tunable demultiplexer of the second embodiment comprises: an input waveguide 210 through which beams having broadband optical signals are separately guided; an input coupler 250 comprising an optical deflector 240 by which the beams transmitted through the input waveguide 210 are deflected into radially propagating beams, wherein the optical deflector 240 comprises a peripheral region having a first effective refractive index, and a deflection pattern region having a predetermined shape bounded by the peripheral region and a second effective refractive index; a circular waveguide 270 through which the beams transmitted through the input coupler 250 propagate; and an output coupler 260 to which the beams output through the circular waveguide 270 are coupled. In this construction, the radially spreading beams originate from a specific point on a Rowland circle according to variation of the second effective refractive index.

In the above construction, the beams are radiated from the input waveguide 210 and into an input aperture of the input coupler 250, and then out of an output aperture of the output coupler 260 and into the respective terminals of the output waveguide 220. In the coupling construction described above, the input waveguide 210 and the output waveguide 220 are located on the Rowland circle in the same manner as the concave grating described above, and the diameter R of the Rowland circle is a focal length of the input waveguide 210 and the output waveguide 220.

For demultiplexing, the length of each waveguide in the circular waveguide 270 is designed such that constructive interference with the adjacent circular waveguide occurs. Here, the circular waveguide 270 plays the same role as the concave grating, so that the above construction is referred to as an arrayed waveguide grating or a phaser.

In this construction, when an electrical signal is applied to the deflection pattern formed in the input coupler 250, the radiating beams are deflected and the position of the input waveguide 210 moves along the Rowland circle. Here, a variation in the virtual position of the input waveguide 210 due to the optical deflector 240 changes a phase difference of the beams entering the input aperture of the input coupler 250, and thus, the wavelength of the beams coupled to the output waveguide 220 changes. The beams deflected by the electrical signal change the phases of the beams entering the input aperture of the input coupler 250, and thus, the wavelengths of the beams in the output waveguide 220 change.

(Tunable Laser According to a Third Embodiment)

A tunable laser according to a third embodiment of the present invention will now be described with reference to FIG. 6, which is a schematic diagram thereof.

The tunable laser is a single integrated external resonant tunable laser in which an optical amplifier 510, an optical deflector 530, and a concave grating 520 are integrated.

Beams exiting out of one end of the optical amplifier 510 are incident on the concave grating 520 via the optical deflector 530. Among the incident beams, only a specific wavelength is fed back to the optical amplifier 510 from the grating 520. In this construction, the concave grating 520 and the other end of the optical amplifier 510 have reflective planes, thereby forming a resonator and acting as a laser diode.

The optical deflector 530 comprises a peripheral region having a first effective refractive index $n_1$, and a deflection pattern region having a predetermined shape bounded by the peripheral region and a second effective refractive index $n_2$ that varies in response to an external electrical signal, so that beams are deflected by refraction (according to Snell's law) at a boundary interface between the peripheral region and the deflection pattern region.

Figure 6:
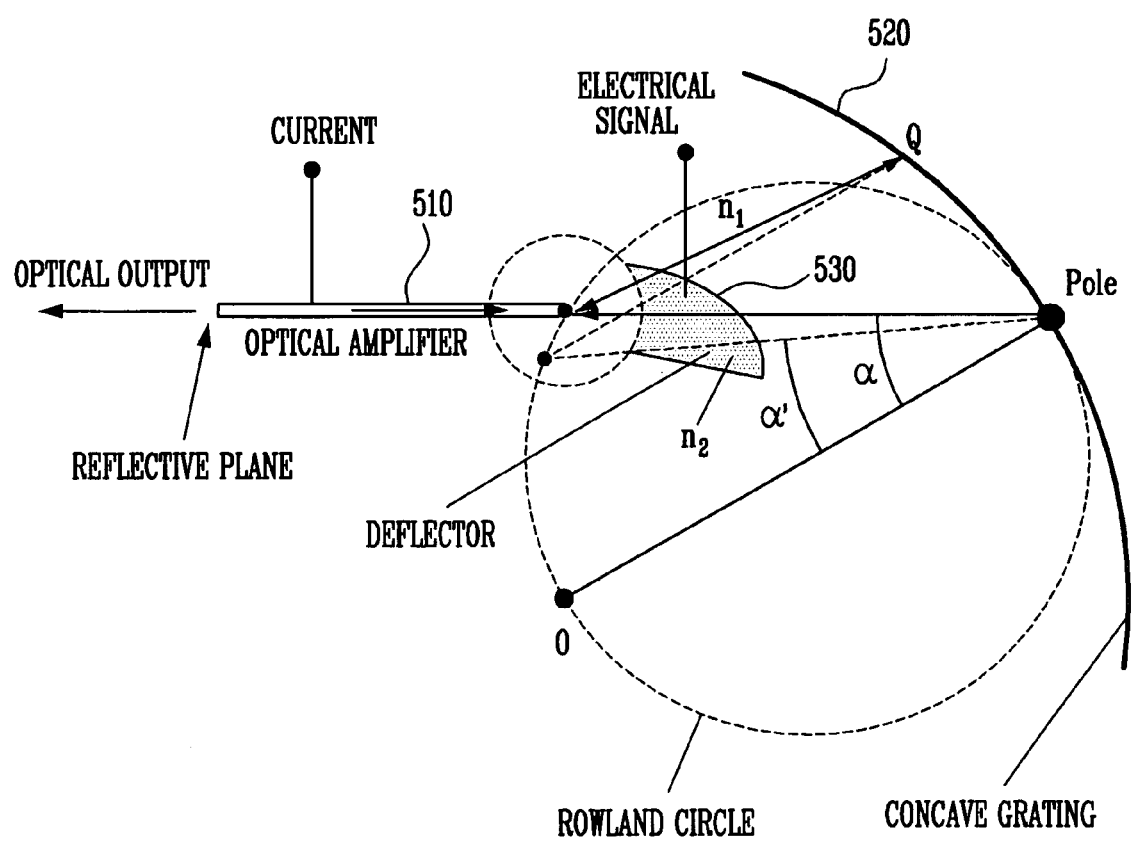
FIG. 6 is a schematic diagram of a tunable laser according to a third embodiment of the present invention.

In FIG. 6, the optical deflector 530 is designed such that the position of a point source of the beams radiating out of the optical amplifier 510 moves virtually along the Rowland circle. The optical deflector 530 is the same as the optical deflector 140 of the first embodiment. Further, beams refracted through the optical deflector 530 are shown as red dotted lines in the drawings, and an incident angle is changed from $\alpha$ to $\alpha'$.

With the change of the incident angle, the wavelengths of the diffracted beams are changed based on the Littrow diffraction formula:

$$m\lambda = 2n_1 d \sin\alpha \qquad \text{[Equation 6]}$$

where m is diffraction order, $\lambda$ is wavelength, $n_1$ is refractive index of the waveguide layer, and d is a period of the grating.

Compared with the first embodiment in which the optical deflector 140 is integrated around the input waveguide to deflect input beams so that the combined wavelength in the output waveguide varies, the construction of the tunable laser according to the fifth embodiment follows the Littrow diffraction formula.

Figure 8:
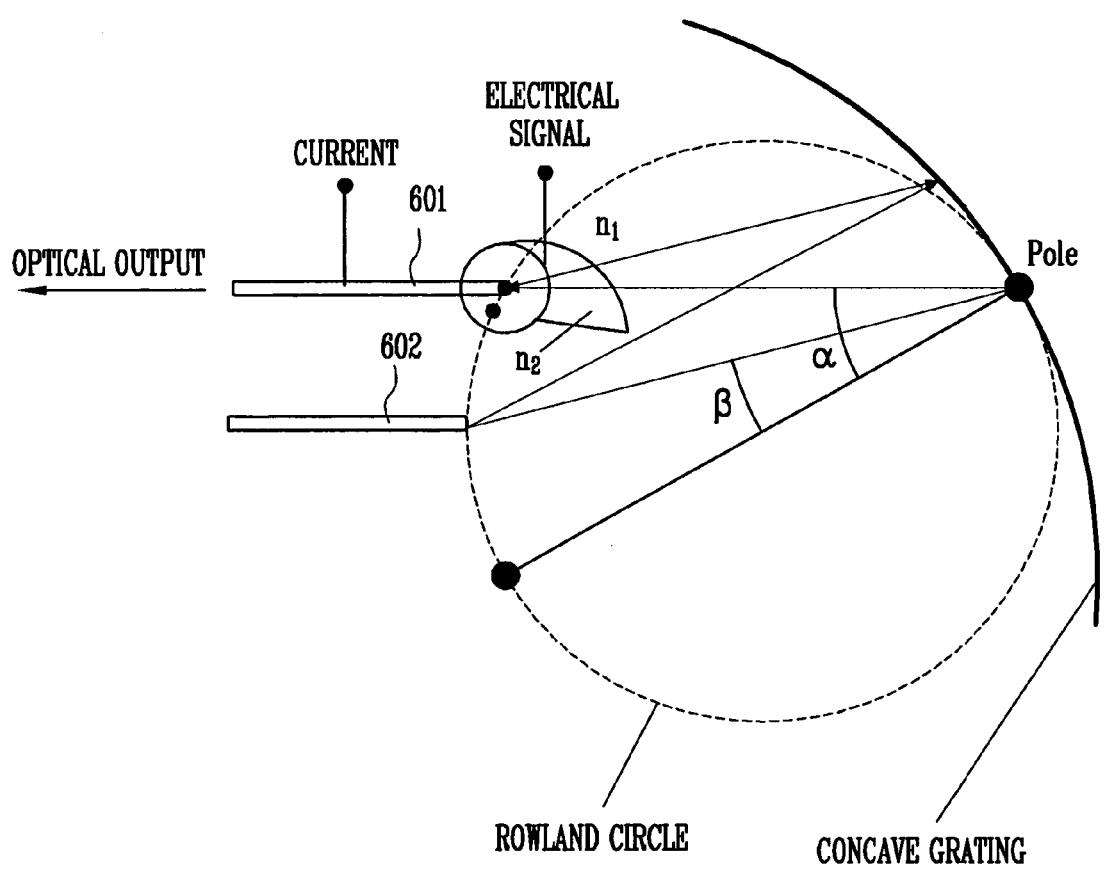
FIG. 8 is a schematic diagram of a tunable laser added a waveguide or optical amplifier.

The construction has been configured according to the Littrow condition in Equation 6, but this can be applied to other structures according to the Littman condition in Equation 7. The waveguide or optical amplifier must be added as illustrated in FIG. 8. In FIG. 8, the left sides of the optical amplifier 601 and 602 become the reflection sides, and resonance is generated by the two reflection sides.

$$m\lambda = n_1 d(\sin\alpha + \sin\beta) \qquad \text{[Equation 7]}$$

Figure 7A:
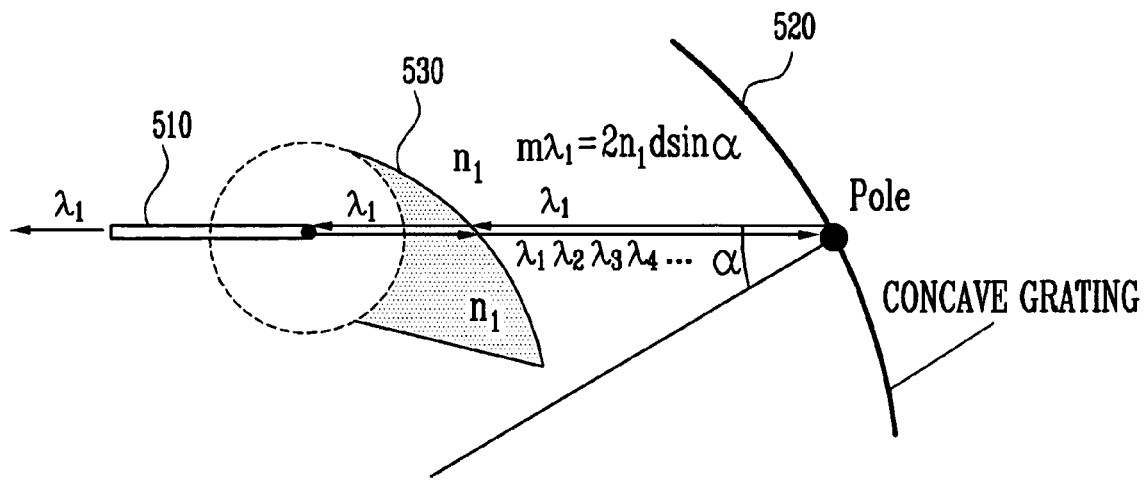
FIGS. 7A and 7B are diagrams for illustrating a tuning characteristic of the tunable laser according to the third embodiment of the present invention.
Figure 7B:
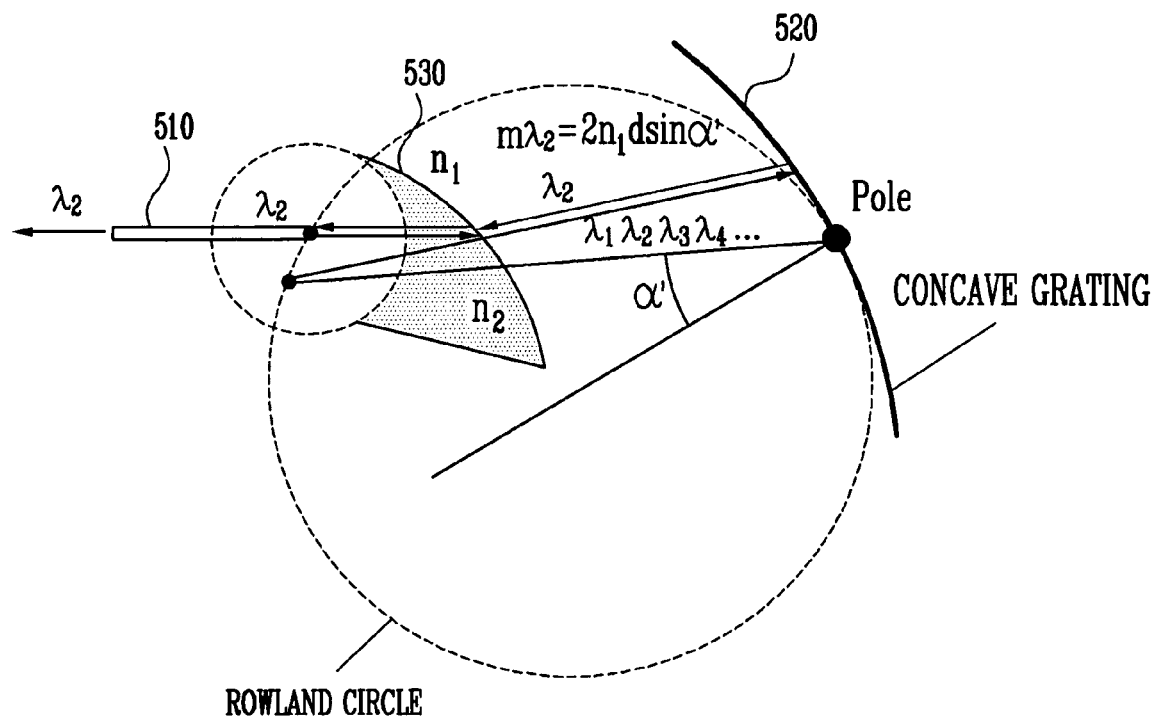

FIGS. 7A and 7B are diagrams for illustrating a tuning characteristic of the tunable laser according to the third embodiment of the present invention.

Figure 9A:
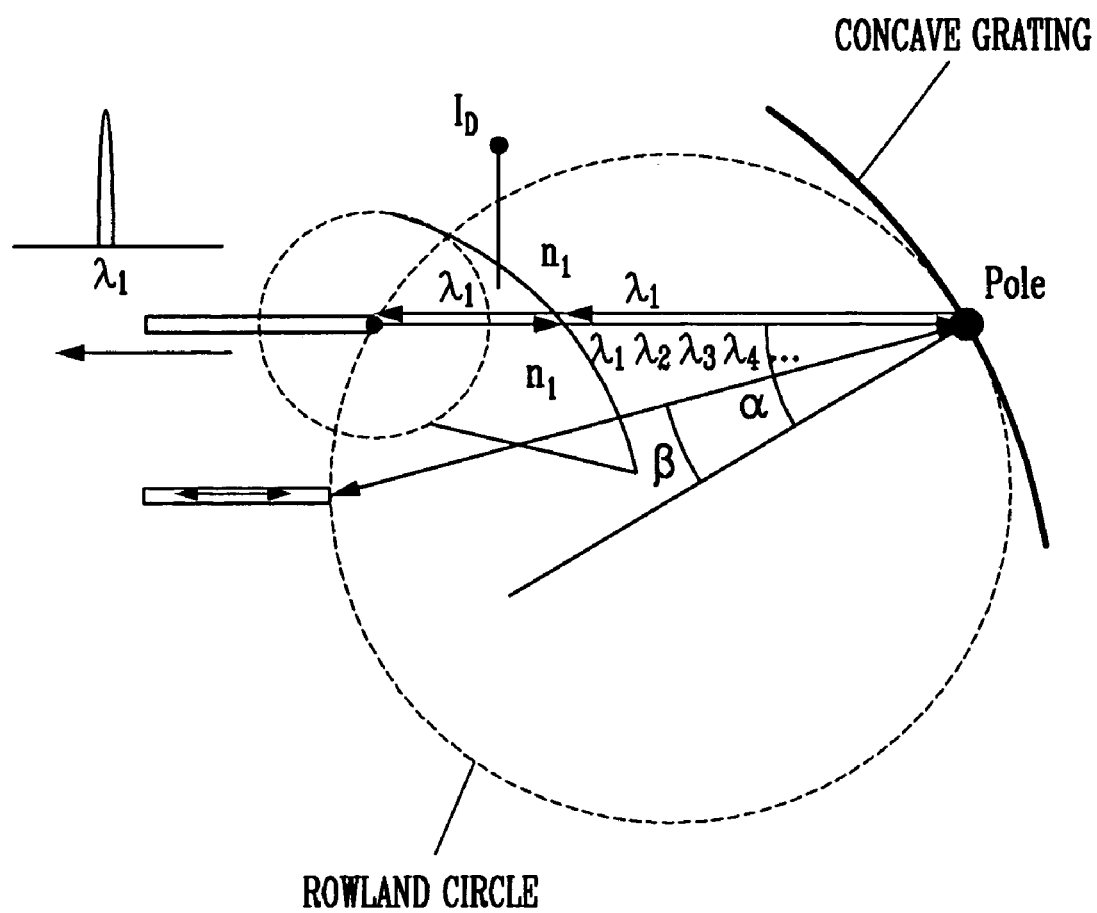
FIGS. 9A and 9B are diagrams for illustrating a tuning characteristic of the tunable laser according to the fourth embodiment of the present invention.
Figure 9B:
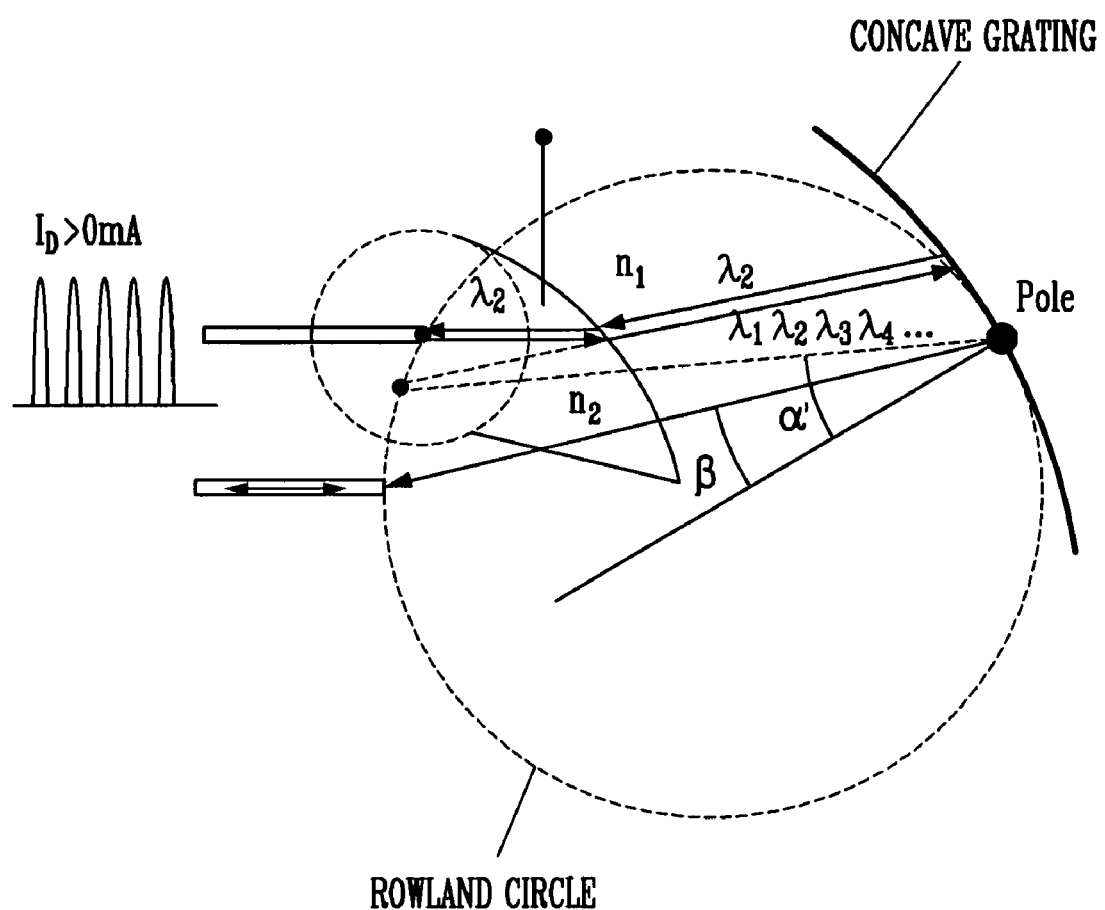

FIGS. 9A and 9B are diagrams for illustrating a tuning characteristic of the tunable laser according to the fourth embodiment of the present invention.

Referring to FIG. 7A, a beam characteristic is shown in a case where no electrical signal is applied to the optical deflector 530, the beams having a generated optical gain in the optical amplifier 510 pass through the optical deflector 530, and the optical deflector 530 pattern region has the same effective refractive index as the peripheral region. Thus, refraction does not occur. Only the specific wavelength $\lambda_1$ of the beams incident into the concave grating 520 is fed back to the optical amplifier 510 based on the incident angle $\alpha$ in Equation 6. The beam having the wavelength $\lambda_1$ fed back to the optical amplifier 510 is injection-locked within the optical amplifier 510, resonated, and emitted from the left end of the optical amplifier 510.

Referring to FIG. 7B, the beam characteristic is shown in a case where an electrical signal is applied in the optical deflector pattern 530 to change the refractive index of the core layer in the pattern from $n_1$ to $n_2$. The beams generated in the optical amplifier pass through deflector patterns and are deflected according to variation of the refractive index of the core layer in the deflector. The source point of the deflected beams virtually passes along the Rowland circle as shown in FIG. 7B, and the incident angle of the refracted beams changes correspondingly from $\alpha$ to $\alpha'$. The wavelength of the diffracted beams is therefore changed from $\lambda_1$ to $\lambda_2$ based on Equation 1 due to the changed incident angle.

The shape of the optical deflector pattern has been designed according to from the perspective of ray-optics so that it is in accordance with the Rowland circle, but the deflector pattern can change according to the construction of the grating. The construction of the optical deflector and tuning characteristic of the tunable laser can be generalized as illustrated in FIG. 10.

Figure 10:
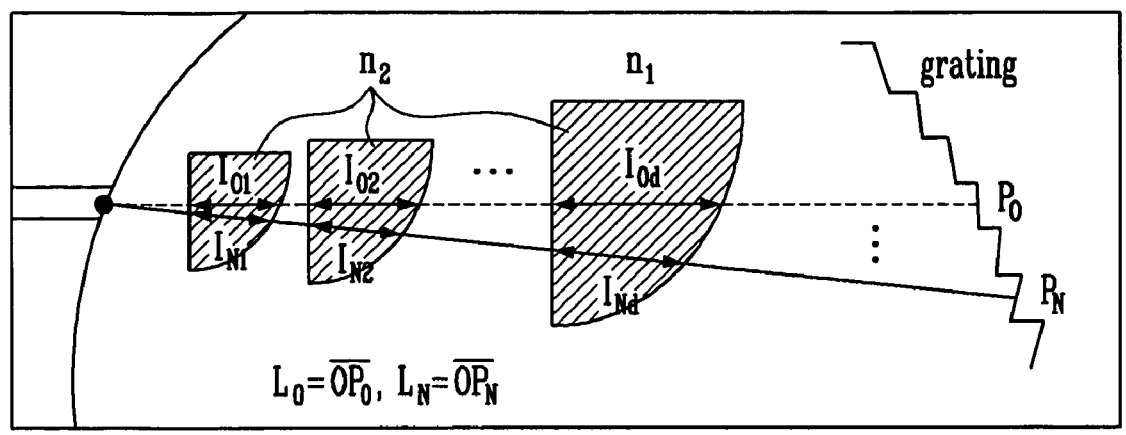
FIG. 10 is a schematic view of DE pattern.

FIG. 10 shows the schematic view of deflector pattern. Out of consideration for the beam spreading to the grating, deflector pattern size is designed to be enlarged with the increase of the number of deflector d. Each pattern has two interfaces along the optical path of the beam and one side of the pattern is designed perpendicular to the waveguide. To determine the curves of the other interfaces, we consider the light that is focused back to the waveguide after diffraction by the grating. Here, the phase difference between two adjacent grating elements must be equal to a multiple of $2\pi$ for the lasing wavelength $\lambda$. Nth phase difference $\Delta\Phi_N$ between the light reflected by the grating facets centered at $P_N$ (Nth element) and $P_0$ (pole) points can be expressed by Equation 8.

$$\Delta\Phi_N = \Phi_{\overline{AP_N}} - \Phi_{\overline{AP_0}} \qquad \text{[Equation 8]}$$
$$= \frac{4\pi}{\lambda}\left(n_0 L_N - (n_0 - n_D)\sum_{a=1}^{d} l_{Na}\right) -$$
$$\frac{4\pi}{\lambda}\left(n_0 L_0 - (n_0 - n_D)\sum_{a=1}^{d} l_{0a}\right)$$
$$= 2\pi mN$$

where $n_D$ and $n_0$ are effective refractive index of the inside and outside of the deflector patterns, respectively. m is the grating order and N is the number of grating elements from the pole. From the Equation 8, wavelength tuning $\Delta\lambda$ can be obtained by the following Equation 9.

$$\Delta\lambda = -\frac{2}{mN}\sum_{a=1}^{d}(l_{0a} - l_{Na})\Delta n_D \qquad \text{[Equation 9]}$$

where $\Delta n_D$ is the effective refractive index change within deflector patterns which strongly depends on the optical confinement factor and the material refractive index change of guide-core. For given m, $l_{01\sim d}$, and $\Delta n_{DE}$, the curves of interfaces can be obtained from the traces of $l_{N1\sim d}$ with respect to $\Delta\lambda$. However, in case of more than two deflector patterns, there can be uncountable combinations of $l_{N1\sim d}$. Thus, the wavelength tuning for individual deflector pattern $\Delta\lambda_a$ is defined as Equation 10 for convenience.

$$\Delta\lambda_a = -\frac{2}{mN}(l_{0a} - l_{Na})\Delta n_D \qquad \text{[Equation 10]}$$

where the summation of $\Delta\lambda_a$ becomes $\Delta\lambda$. By the current injection into deflector pattern, $\Delta n_D$ is decreased due to carrier-induced change in refractive index and thus $\Delta\lambda_a$ can be positive for $l_{Na} < l_{0a}$ and negative for $l_{Na} > l_{0a}$.

The conventional tunable demultiplexer construction in which several input waveguides are rearranged or an optical fiber is repositioned to perform wavelength tuning has a problem in that the tuning can only be performed in discrete intervals and at a slow speed. In contrast, the present construction has a continuous tuning characteristic, a high tuning speed, and structural stability, due to electrical tuning. In the present construction, a processing error generated in fabricating the conventional demultiplexer is corrected so that the manufacturing yield is enhanced, and the present construction has a wide range of applications such as in a tunable filter or router.

The tunable demultiplexer of the present invention described above corrects processing error generated in the conventional demultiplexer due to a continuous wavelength tuning characteristic, so that manufacturing yield is enhanced, and the tunable demultiplexer has a wide range of applications such as in a tunable filter or router.

In addition, according to the present invention, wavelength is electrically tuned, so that the construction is structurally stable and the tuning speed is extremely high.

With the tunable laser of the present invention, an incident angle on the concave grating is continuously changed with the increase of applied electrical signal in the optical deflector, so that the tuning characteristic is continuous, and the semiconductor optical amplifier (SOA), the optical deflector, and the concave grating can be fabricated on a single substrate. Therefore, no optical alignment is required and besides the device size is extremely small compared with the conventional external-cavity laser scheme.

On one hand, a phase control section can be inserted between the optical amplifier and optical deflector. The phase control section performs the role of matching the phase between beams coming into the optical amplifier from the grating and beams emitted from the optical amplifier. Therefore, as the device is lasing at a certain wavelength, the wavelength is minutely controlled with that channel PC current $I_{PC}$ due to the variation of phase condition.

Figure 11:
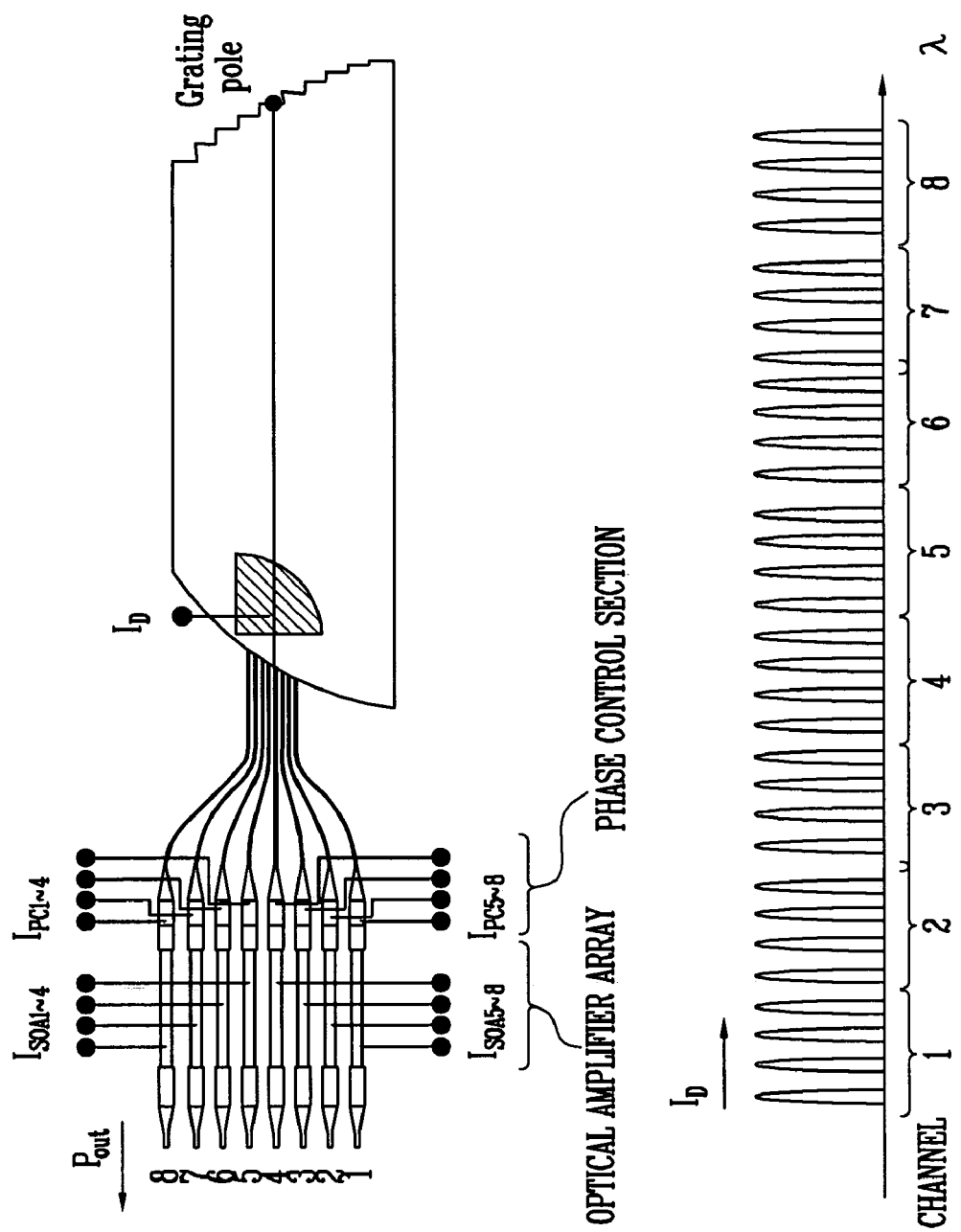
FIG. 11 is a schematic diagram of a tunable laser having 8-channel construction.
Figure 12:
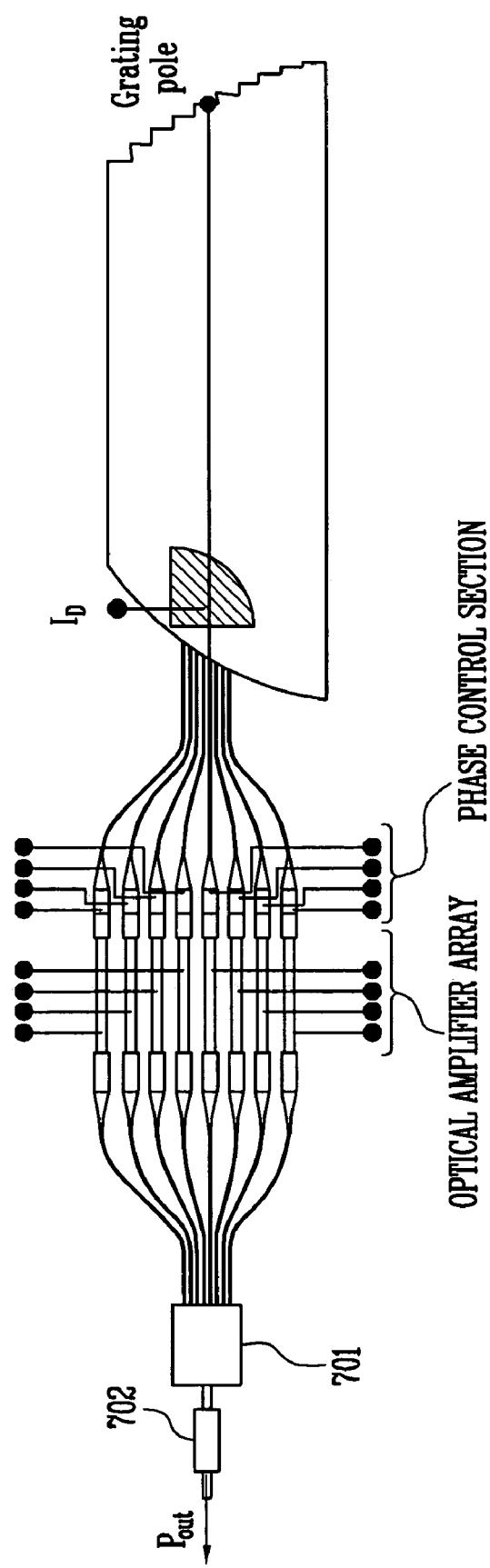
FIG. 12 is a schematic diagram of a tunable laser inserted an optical combiner and optical amplifier.

Furthermore, the construction shown in FIG. 11 can be extended to a construction in which wide tuning range can be obtained. In FIG. 11, as an example, the 8-channel construction is shown. When the current $I_{SOA}$ was injected into one SOA channel, lasing occurred at a wavelength corresponding to the Littrow condition of light back from the grating to that channel. Different channels lased at different wavelengths in accord with their position relative to the grating. Therefore, the tuning range is multiplied as the channel number is increased ($\Delta\lambda_T$ (total tuning range)=N (channel number)×$\Delta\lambda_I$ (individual tuning range)). Additionally, the optical combiner 701 and optical amplifier 702 can be inserted into output stage in order to obtain output power through one port and enhance output power, respectively, as illustrated in FIG. 12.

Exemplary embodiments of the present invention have been described in detail, however the present invention is not limited thereto. Those skilled in the art will appreciate that a variety of modifications can be made to the described embodiments without departing from the spirit and scope of the present invention as defined by the appended claims and their equivalents.

What is claimed is:

1. A tunable demultiplexer comprising:
   an input waveguide for guiding beams having a plurality of different wavelengths to an optical deflector, wherein the end of the input waveguide through which the beams enter into the optical deflector is defined as an actual light source, the optical deflector comprising:
      a peripheral region having a first effective refractive index; and
      a non-prism deflection pattern region having a second effective refractive index and having a predetermined nonlinear shape bounded by the peripheral region
         wherein the beams in the deflection pattern region radially spread out from the actual light source,
         wherein the radially spreading beams are deflected by an angle at the nonlinear boundary as the deflected radially spreading beams propagate in the peripheral region,
         wherein the deflected radially spreading beams in the peripheral region is equivalent to non-deflected beams radially spreading from a virtual light source the location of which virtual light source is different from the location of the actual light source,
         wherein the location of the virtual light source is variable by varying the second effective refractive index by which the angle of deflection is controlled, and
         wherein the deflected radially spreading beams propagate through the peripheral region to a grating;
   the grating for diffracting the deflected radially spreading beams according to different wavelengths; and
   output waveguides for selecting and outputting the diffracted beams from the grating.

2. The tunable demultiplexer according to claim 1, wherein the optical deflector comprises a lower cladding layer, an upper cladding layer, and a core layer.

3. The tunable demultiplexer according to claim 1, wherein the second effective refractive index is variable by injecting current into the deflection pattern region.

4. The tunable demultiplexer according to claim 3, wherein the peripheral region and the deflection pattern region having the predetermined nonlinear shape are divided in terms of a difference of current applied to a core layer of each of the peripheral region and the deflection pattern region.

5. The tunable demultiplexer according to claim 1, wherein an incidence angle of the each deflected beam on the grating pole changes.

6. The tunable demultiplexer according to claim 1, wherein the actual light source and the virtual light source are positioned on the circumference of a circle or a parabola or a straight line.

7. A tunable demultiplexer comprising:
   an input waveguide for guiding beams having a plurality of different wavelengths to an input coupler having an optical deflector, wherein the end of the input waveguide through which the beams enter into the optical deflector is defined as an actual light source, the optical deflector comprising:
      a peripheral region having a first effective refractive index; and
      a non-prism deflection pattern region having a second effective refractive index and having a predetermined nonlinear shape bounded by the peripheral region
         wherein the beams in the deflection pattern region radially spread out from the actual light source,
         wherein the radially spreading beams are deflected by an angle at the nonlinear boundary as the deflected radially spreading beams propagate in the peripheral region, wherein the deflected radially spreading beams in the peripheral region is equivalent to non-deflected beams radially spreading from a virtual light source, the location of which virtual light source is different from the location of the actual light source, wherein the virtual light source and the actual light source are located on the circumference of a Rowland circle, wherein the location of the virtual light source is variable along the Rowland circle by varying the second effective refractive index by which the angle of deflection is controlled, and wherein the deflected raidally spreading beams propagate through the peripheral region to a waveguide;

the waveguide through which the beams transmitted through the input coupler propagate; and an output coupler to which the beams output through the waveguide are coupled.

8. A tunable laser comprising:

an optical amplifier having first and second ends;

an optical deflector integrated into the optical amplifier for transmitting beams exiting from the first end to a concave grating and receiving the beams reflected from the concave grating at the second end, the optical deflector comprising:

a peripheral region having a first effective refractive index; and a non-prism deflection pattern region having a second effective refractive index and having a predetermined nonlinear shape bounded by the peripheral region wherein the beams in the deflection pattern region radially spread out from the first end, wherein the radially spreading beams are deflected by an angle at the nonlinear boundary as the deflected radially spreading beams propagate in the peripheral region, wherein the deflected radially spreading beams in the peripheral region is equivalent to non-deflected beams radially spreading from a virtual first end, the location of which virtual first end is different from the location of the first end, wherein the location of the virtual first end is variable by varying the second effective refractive index by which the angle of deflection is controlled, wherein the deflected radially spreading beams propagate through the peripheral region to the concave grating, the concave grating optically connected to the optical deflector, wherein a beam having a predetermined wavelength is reflected by the concave grating along a line between the virtual first end to a point on the concave grating and, as the reflected beam enters the peripheral region, the reflected beam is deflected at the non-linear boundary between the peripheral region and the deflection pattern region such that the beam having the predetermined wavelength is transmitted back into the first end for output at the second end of the optical amplifier.

9. The tunable laser according to claim 8, wherein the optical deflector comprises a lower cladding layer, an upper cladding layer, and a core layer.

10. The tunable laser according to claim 8, wherein the second effective refractive index is variable by injecting current into the deflection pattern region.

11. The tunable laser according to claim 10, wherein the peripheral region and the deflection pattern region having the predetermined nonlinear shape are divided in terms of a difference of current applied to a core layer of each of the peripheral region and the deflection pattern region.

12. The tunable laser according to claim 8, wherein the first end and the virtual first end are positioned on the circumference of a circle or a parabola or a straight line.

13. The tunable laser according to claim 6, wherein the first and the virtual first end are positioned on the circumference of a Rowland circle having a diameter, and wherein the diameter of the Rowland circle is a radius of the concave grating.

14. The tunable laser according to claim 12, wherein the first and the virtual first end are positioned on the circumference of a Rowland circle having a diameter, and wherein the diameter of the Rowland circle is a radius of the concave grating.

* * * * *